(12) United States Patent
Dieny et al.

(10) Patent No.: US 8,068,316 B2
(45) Date of Patent: Nov. 29, 2011

(54) LOW NOISE MAGNETIC FIELD SENSOR

(75) Inventors: Bernard Dieny, Lans en Vercors (FR); Claire Baraduc, Chirens (FR); Sébastien Petit, Paris (FR); Christophe Thirion, Lans en Vercors (FR)

(73) Assignee: Commissariat a l'Energie Atomique, Paris (FR)

( * ) Notice: Subject to any disclaimer, the term of this patent is extended or adjusted under 35 U.S.C. 154(b) by 820 days.

(21) Appl. No.: 12/123,059

(22) Filed: May 19, 2008

(65) Prior Publication Data
US 2009/0015972 A1 Jan. 15, 2009

(30) Foreign Application Priority Data

Jul. 10, 2007 (FR) .................... 07 56394

(51) Int. Cl.
*G11B 5/127* (2006.01)
(52) U.S. Cl. .................. 360/324.11
(58) Field of Classification Search .......... 360/319, 360/245.3, 316, 314, 324.12, 317, 324.1, 360/313, 324.2; 29/603.18, 603.14, 603.01, 29/603.04
See application file for complete search history.

(56) References Cited

U.S. PATENT DOCUMENTS

| | | | |
|---|---|---|---|
| 6,532,164 B2 | 3/2003 | Redon et al. | |
| 6,603,677 B2 | 8/2003 | Redon et al. | |
| 6,888,742 B1 | 5/2005 | Nguyen et al. | |
| 7,916,436 B2* | 3/2011 | Ishizone et al. | 360/324.2 |
| 2002/0061421 A1 | 5/2002 | Dieny | |
| 2005/0041342 A1 | 2/2005 | Huai et al. | |
| 2005/0280058 A1 | 12/2005 | Pakala et al. | |
| 2008/0291586 A1* | 11/2008 | Ishizone et al. | 360/324.11 |
| 2009/0002898 A1* | 1/2009 | Childress et al. | 360/324.1 |

OTHER PUBLICATIONS

D. Houssameddine, et al., "Spin-torque oscillator using a perpendicular polarizer and a planar free layer", Nature Publishing Group, vol. 6, No. 6, XP002479794, ISSN: 1476-1122, Jun. 2007, pp. 447-453.
B. Dieny, "Giant magnetoresistance in spin-valve multilayers", Journal of Magnetism and Magnetic Materials, vol. 136, (1994), pp. 335-359.
Neil Smith, et al., "White-noise magnetization fluctuations in magnetoresistive heads", Applied Physics Letters, vol. 78, No. 10, Mar. 5, 2001, pp. 1448-1450.
L. Berger, "Emission of spin waves by a magnetic multilayer traversed by a current", Physical Review B, vol. 54, No. 13, Oct. 1, 1996, pp. 9353-9358.
J. C. Slonczewski, et al., "Current-driven excitation of magnetic multilayers", Journal of Magnetism and Magnetic Materials, vol. 159, (1996), pp. L1-L7. Z. Li, et al., "Magnetization dynamics with a spin-transfer torque", Physical Review B, vol. 68, (2003), pp. 024404-1-024404-10.
U.S. Appl. No. 12/123,174, filed May 19, 2008, Dieny.

* cited by examiner

*Primary Examiner* — Allen Cao
(74) *Attorney, Agent, or Firm* — Oblon, Spivak, McClelland, Maier & Neustadt, L.L.P.

(57) ABSTRACT

A magnetoresistive sensor including: a first pinned-magnetization magnetic layer and a free-magnetization magnetic layer, separated by first separating layer for magnetic uncoupling. The sensor further includes a second pinned-magnetization magnetic layer, separated from the free-magnetization magnetic layer by a second separating layer for magnetic uncoupling, the first and second separating layers being located on either side of the free-magnetization magnetic layer, and the respective magnetizations of the first pinned-magnetization magnetic layer and of the free-magnetization magnetic layer, in the absence of an external field, are substantially orthogonal. The orientation of the magnetization of the second pinned layer is selectable.

31 Claims, 8 Drawing Sheets

LOW NOISE MAGNETIC FIELD SENSOR

TECHNICAL FIELD

The present invention relates to the field of magnetic field sensors and more particularly to the field of spin valves or magnetic tunnel junctions, with a current geometry perpendicular to the plane of the layers.

In particular, it has an application in the field of magnetic recording.

PRIOR ART

Magnetic field sensors are used in numerous applications, reading heads for computer hard disks, devices for reading magnetic tracks, magnetic ink, position encoders, shaft position encoders, electronic compasses, etc.

Magnetic field sensors have been the subject of considerable research in recent years, in order to keep pace with the rapid increase in the recording density on hard disks.

Since 1992, the magnetic field sensors used in computer hard disk reading heads are of the magnetoresistive type. In a sensor of this type, the magnetic field variations modify the resistance of a magnetoresistive material, resulting in voltage variations at the terminals of the sensor.

The first magnetoresistive sensors exploited the anisotropy of the magnetoresistance of a magnetic thin layer, that is the dependence of the resistance of such a layer on the angle between the magnetization and the current applied to it.

More recent magnetoresistive sensors have been based on spin valves. A spin valve is generally defined as a structure consisting of two magnetic layers separated by a thin layer of nonmagnetic metal. The magnetization of one of the magnetic layers, called the pinned layer, is maintained fixed by exchange interaction with an antiferromagnetic material. The magnetization of the other magnetic layer, called free or sensitive layer, is free to follow the variations in the magnetic field applied to it. The relative variation in orientation of the respective magnetizations of the two magnetic layers induces a change in electrical resistance in the nonmagnetic layer (called the giant magnetoresistance effect). A description of spin valves is found for example in the article by B. Dieny entitled "Giant magnetoresistance in spin-valve multilayers", published in Journ. Magn. Mater. 136, (1994), pp. 335-359.

The first spin valves used a current geometry parallel to the plane of the layers in a configuration called CIP (Current In Plane). The reduction of the size of the bits on the hard disks (about 100 nm×40 nm in 2006) lead to the development of spin valves having a CPP (Current Perpendicular to Plane) configuration having both a higher integration level and a wider variation in magnetoresistance.

According to this configuration, the screens that frame the magnetoresistive element also serve as a current input and a voltage tap. A description of a spin valve having a CPP configuration can be found in particular in application WO-A-97/44781.

FIG. 1 schematically illustrates a magnetoresistive sensor using a spin valve 100 in a CPP configuration.

The two metal screens 101 and 102 serve to bound the magnetic field measurement zone and as a current input and voltage tap. The width d of this zone gives the maximum read resolution. The spin valve essentially consists of an antiferromagnetic layer 110, a magnetic layer 120 of which the magnetization is pinned by the layer 110, a nonmagnetic thin layer 130, and a magnetic layer 140 of which the magnetization is free to follow the external magnetic field. A bias magnetic field may be applied to the free layer 140 by means of a pair of lateral permanent magnets (not shown) so as to give it a predefined magnetization orientation, in the absence of an external magnetic field.

The resistance of the spin valve is low if the magnetization directions of the free layer 140 and of the pinned layer 120 are parallel, and high in the case in which they are antiparallel. When a magnetic field to be measured is applied in the plane of the layers, this field produces a rotation of the magnetization of the free layer in said plane. The relative orientation of the magnetization of the free layer with regard to that of the thin layer determines the resistance of the spin valve.

Spin valves with a CPP configuration, due to their small dimensions, have a very low resistance. In order to produce impedance sensors adapted to the typical input impedance of a preamplifier (typically a few tens of Ohms), it is possible to use magnetoresistive materials having a high surface resistance (measured in $\Omega \cdot \mu m^2$). For this purpose, it has been proposed to introduce, into the nonmagnetic separating layer, a discontinuous oxide layer designed to locally confine the current paths. However, this approach leads to very high current densities, and hence to electromigration phenomena detrimental to the service life of the sensor.

Finally, the most promising technique appears to be the one based on the use of magnetoresistive tunnel junctions or MTJs. An MTJ junction is distinguished from a spin valve with a CPP configuration in that the separating layer 130 is made of an insulating material, for example of alumina or magnesia (MgO). The tunnel barrier must have a sufficiently low resistance (measured by the product of resistance and area RA for Resistance Area), so that the sensor has a resistance compatible with the input impedance of the preamplifier and to minimize the shot noise.

One important feature of any magnetoresistive sensor is the noise affecting the read signal. In magnetoresistive sensors, this may arise from various sources. As stated in the article by N. Smith et al. entitled "*White-noise magnetization fluctuations in magnetoresistive heads*", published in Appl. Phys. Lett. 78 (2001), pp. 1148-1150, when a spin valve has a low relative variation in magnetoresistance, that is a low $\Delta R/R$ ratio, where $\Delta R$ is the variation in resistance between the parallel and antiparallel states, the predominant source of noise is of electrical origin, more precisely the Johnson noise resulting from the Brownian motion of the conduction electrons. On the other hand, if this ratio is high, the predominant source of noise is of magnetic origin. In fact, in this case, the fluctuations in magnetization in the sensitive layer can cause wide fluctuations in the resistance of the sensor. These magnetization fluctuations may be caused by the thermal agitation or may result from irreversible movements of the walls or the instability of magnetic domains. For the same dissipated power, the thermal fluctuations are commensurately higher as the size of the sensor is smaller.

In the same way, for an MTJ junction sensor having a low ratio $\Delta R/R$, the predominant source of noise is of electrical origin, that is the shot noise of the tunnel junction, whereas at a high $\Delta R/R$ ratio, the noise is essentially of magnetic origin as stated above.

Thus, for magnetoresistive sensors with spin valves or magnetic tunnel junctions having very high sensitivity (that is having a high ratio $\Delta R/R$) the signal-to-noise ratio (SNR) is essentially conditioned by the noise of magnetic origin.

FIG. 2 shows the typical curve of the noise power density (normalized by $RI^2$ where R is the resistance of the sensor and I the current traversing it) affecting the measurement signal in a magnetoresistive sensor (based on a CPP spin valve or a magnetic tunnel junction) as a function of the frequency f of the magnetic field (solid line curve denoted $\rho_0$). Three distinct noise regimes are distinguished.

In a low frequency zone, denoted zone (I), extending from 0 to a few hundred MHz, the measurement noise is the sum of the white noise, partially of electrical origin (Johnson noise or shot noise) and partially of magnetic origin (thermal magnetization fluctuations in the sensitive layer of the sensor), and a noise at 1/f resulting from an insufficient magnetization of the sensitive layer by the bias magnetic field. In fact, an insufficient polarization can give rise in the sensitive layer to walls that are liable to be pinned or even to unstable magnetic domains of which the magnetization may jump during the rotation of the magnetization of the sensitive layer.

In a high frequency zone, denoted zone (III), typically extending from about 1.5 GHz to a few tens of GHz, the shape of the noise curve is due to a ferromagnetic resonance phenomenon or FMR. The spin wave excitations are thermally activated with an amplitude peak when their frequency corresponds to the natural precession frequency of the magnetization of the sensitive layer (FMR).

An intermediate zone, denoted zone (II), separates the low and high frequency zones. In this zone, the noise is essentially white, the noise in 1/f and the FMR resonance are virtually absent.

It is consequently the object of the present invention to propose a magnetoresistive sensor structure having very high performance (high sensitivity, small dimensions) while having a high signal-to-noise ratio in an advantageous frequency range.

SUMMARY OF THE INVENTION

The present invention is defined by a magnetoresistive sensor comprising a first pinned-magnetization magnetic layer, called first pinned layer, and a second free-magnetization magnetic layer, called sensitive layer, separated by a first separating layer for magnetic uncoupling, wherein it further comprises a second pinned-magnetization magnetic layer, called second pinned layer, separated from said sensitive layer by a second separating layer for magnetic uncoupling, the first and second separating layers being located on either side of said sensitive layer, the respective magnetizations of said first pinned layer and of said sensitive layer, in the absence of an external field, being substantially orthogonal.

According to a first embodiment, said sensor is suitable for circulating a continuous current from the first pinned layer to the second pinned layer, and the magnetization ($\pi_2$) of the second pinned layer being oriented in an intermediate direction between the magnetization direction ($\pi_1$) of the first pinned layer and the magnetization direction ($M_0$) of said sensitive layer, in the absence of an external field, the extreme orientations being permitted.

According to a second embodiment, said sensor is suitable for circulating a continuous current from the first pinned layer to the second pinned layer, and the magnetization ($\pi_2$) of the second pinned layer being oriented in an intermediate direction between the magnetization direction ($\pi_1$) of the first pinned layer and the direction opposite to the magnetization direction ($M_0$) of said sensitive layer, in the absence of an external field, the extreme orientations being permitted.

According to a third embodiment, said sensor is suitable for circulating a continuous current from the first pinned layer to the second pinned layer, and the magnetization ($\pi_2$) of the second pinned layer being oriented in an intermediate direction between the direction opposite to the magnetization direction ($\pi_1$) of the first pinned layer and the direction opposite to the magnetization direction ($M_0$) of said sensitive layer, in the absence of an external field, the extreme orientations being permitted.

According to a fourth embodiment, said sensor is suitable for circulating a continuous current from the first pinned layer to the second pinned layer, and the magnetization ($\pi_2$) of the second pinned layer being oriented in an intermediate direction between the direction opposite to the magnetization direction ($\pi_1$) of the first pinned layer and the magnetization direction ($M_0$) of said sensitive layer, in the absence of an external field, the extreme orientations being permitted.

Advantageously, the electrical resistance of the sensitive layer/first separating layer/first pinned layer stack is substantially higher than the electrical resistance of the sensitive layer/second separating layer/second pinned layer stack.

According to a first alternative, the first separating layer is a thin layer of insulation forming a tunnel barrier.

According to a second alternative, the first separating layer is a metal layer.

According to a third alternative, the first separating layer is a composite metal-insulation layer, suitable for locally confining the current paths.

The second separating layer is a metal layer.

Advantageously, the surface resistance of the second separating layer is substantially lower than that of the first separating layer.

The second separating layer is a composite metal-insulation layer, suitable for locally confining the current paths.

The magnetoresistive sensor may comprise a first synthetic ferrimagnetic layer, consisting of first and second magnetic sub-layers containing a first antiferromagnetic coupling layer in a sandwich, the first magnetic sub-layer being pinned by a first antiferromagnetic pinning layer, the second magnetic sub-layer constituting the first pinned layer.

The first separating layer consists of MgO.

The first synthetic ferrimagnetic layer may consist of CoFe/Ru/CoFe where the first and second CoFe magnetic sub-layers have a thickness of 1.5 to 4 nm and the first Ru antiferromagnetic coupling sub-layer has a thickness of 0.5 to 1 nm.

Alternatively, the first synthetic ferrimagnetic layer may consist of CoFe/Ru/CoFeB or CoFe/Ru/CoFe, where the first CoFe magnetic sub-layer has a thickness of 1.5 to 4 nm and the first Ru antiferromagnetic sub-layer has a thickness of 0.5 to 1 nm, and the second magnetic sub-layer consists of CoFeB or CoFe alloy having a face-centered cubic structure with a thickness of between 1.5 and 5 nm.

The first pinning layer may consist of PtMn, PtPdMn, or IrMn, for example of PtMn having a thickness of 15 to 25 nm.

The sensitive layer may consist of a CoFe alloy, in particular $Co_{90}Fe_{10}$.

Alternatively, the sensitive layer may consist of two sub-layers, one of Co or CoFe alloys, having a total thickness of 0.5 to 1.5 nm, directly at the interface between the first separating layer, the other of NiFe having a thickness of about 2 to 4 nm.

The second separating layer may consist of Cu having a thickness of 2 to 5 nm.

The magnetoresistive sensor may comprise a second synthetic ferrimagnetic layer, consisting of third and fourth magnetic sub-layers containing a second antiferromagnetic coupling layer in a sandwich, the fourth magnetic sub-layer being pinned by a second pinning antiferromagnetic layer, the third magnetic sub-layer constituting the second pinned layer.

The second pinning antiferromagnetic layer consists of $Ir_{20}Mn_{80}$ having a thickness between 5 and 10 nm.

The second synthetic ferrimagnetic layer may consist of third and fourth magnetic sub-layers containing a second antiferromagnetic coupling layer in a sandwich, the fourth magnetic sub-layer being pinned by a layer of hard magnetic material, the third magnetic-layer constituting the second pinned layer.

The hard magnetic material may be an alloy based on Co and Cr.

The second pinned layer may consist of a ferromagnetic transition metal, in particular an alloy based on Co, Fe, Ni.

Alternatively, the second pinned layer may consist of $Co_{90}Fe_{10}$, having a thickness of between 2 and 7 nm.

Further alternatively, the second pinned layer consists of CoFeCu or CoFeAg alloy.

The second pinned layer may finally consist of a laminated multilayer ($Co_{90}Fe_{10}$ 1 nm/Cu 0.3 nm) or a CoFe/NiFe bilayer.

Advantageously, the first pinned layer has its magnetization pinned in a first direction by a first pinning antiferromagnetic layer having a first blocking temperature, and the second pinned layer has its magnetization pinned in a second direction by a second pinning antiferromagnetic layer having a second blocking temperature different from the first.

The invention is also defined by a method for fabricating a magnetoresistive sensor, wherein the first pinning antiferromagnetic layer, the first pinned layer, the first separating layer, the sensitive layer, the second separating layer, the second pinned layer, the second pinning antiferromagnetic layer, are deposited in succession on an electrode, and wherein:

if the first blocking temperature is higher than the second blocking temperature, the layers are annealed under a magnetic field oriented along said first direction, the temperature is then lowered to the second blocking temperature, the magnetic field is then oriented along said second direction, and the temperature is lowered to the ambient temperature;

if the second blocking temperature is higher than the first blocking temperature, the layers are annealed under a magnetic field oriented along said second direction, the temperature is then lowered to the first blocking temperature, the magnetic field is then oriented along said first direction, and the temperature is lowered to the ambient temperature.

BRIEF DESCRIPTION OF THE DRAWINGS

Other features and advantages of the invention will appear from a reading of a preferred embodiment of the invention, with reference to the appended figures in which.

DETAILED SUMMARY OF PARTICULAR EMBODIMENTS

The basic idea of the invention is to use the effect called spin transfer effect to reduce the noise of magnetic origin in a magnetoresistive sensor.

The spin transfer effect was predicted in 1996 in CPP type spin valves. A description can be found in particular in the articles by L. Berger in Phys. Rev. B Vol. 54, No. 13, pp. 9353-9539 entitled "Emission of spin waves by a magnetic multilayer traversed by a current" and J. C. Slonczewski in Journal Magn. Magn. 159 (1996) L1-L7, entitled "Current-driven excitation of magnetic layers".

The spin transfer effect can be considered as the dual effect of the magnetoresistance effect. Whereas the magnetoresistance phenomenon serves to control an electrical current based on the magnetization of a magnetic layer, the spin transfer effect serves to adjust the magnetization of a free magnetic layer from a spin polarized current. More precisely, when such a current flows perpendicular to a magnetic layer, the spin of the conducting electrons in this layer is very rapidly reoriented parallel to the local magnetization, which implies a rotation of the electron spin polarization plane. This rotation causes a transfer of the magnetization angular moment of the magnetic layer, resulting in a magnetic torque on this layer.

Figure 3:
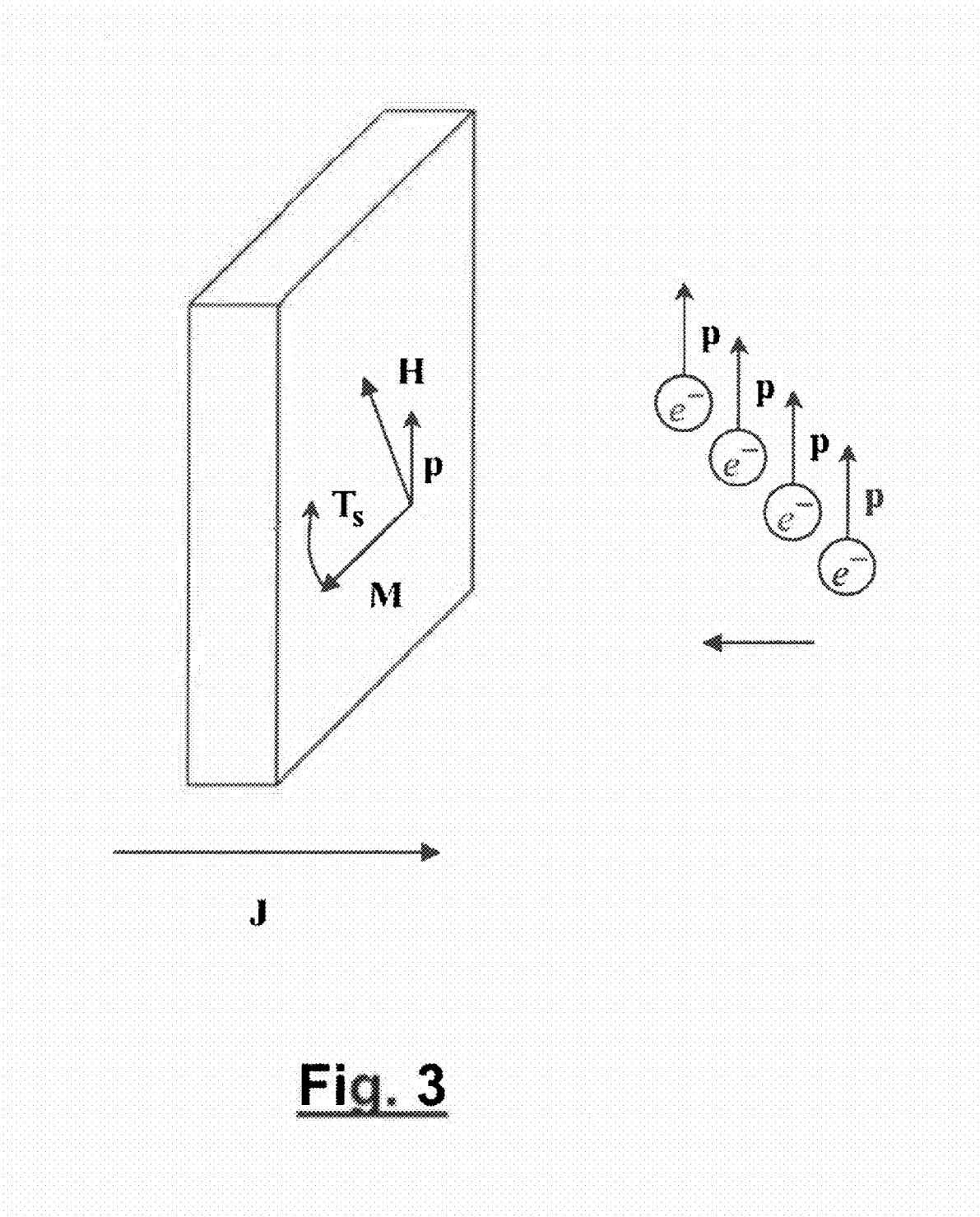
FIG. 3 schematically illustrates the spin transfer effect in a magnetic layer.

FIG. 3 illustrates the spin transfer effect. J denotes the current, spin-polarized in the p direction, where p is a unit vector oriented in the polarization direction. This current passes through a magnetic layer with magnetization M.

It can be demonstrated that the equation governing the magnetization dynamics can be written in (Landau, Lifschitz, Gilbert or LLG equation, corrected for the Slonczewski term):

$$\frac{dM}{dt} = -\gamma(M \times H) + \gamma \frac{a_j(\theta)}{M_s} M \times (M \times p) + \frac{\alpha}{M_s} M \times \frac{dM}{dt} \quad (1)$$

where H is the effective magnetic field in the layer, $\gamma$ is the gyromagnetic coefficient, $\alpha$ is a damping coefficient, called the Gilbert coefficient, $M_s$ is the saturation magnetization in the layer, and $$a_j(\theta) = \frac{\hbar}{2e} \frac{g(\theta)}{M_s \delta} j \quad (2)$$

where j is the spin-polarized current density, $\delta$ is the thickness of the layer, $g(\theta)$ is an efficiency factor depending on the angle $\theta$ between the polarization direction p and the magnetization M of the layer, $\hbar$ is the Planck constant and e the electric charge of the electron.

The first term on the right of the equation (1) is a precession torque of the magnetization around the effective magnetic field H. The expression effective magnetic field refers to the magnetic field effectively undergone by the layer, that is the sum of the applied external field, the demagnetization field and the anisotropic field. The second term represents a spin transfer torque $T_s$ tending to align the magnetization of the layer in the spin polarization direction or in the opposite direction, according to the current sign. Finally, the last term corresponds to a damping of the magnetization movement.

Figure 1:
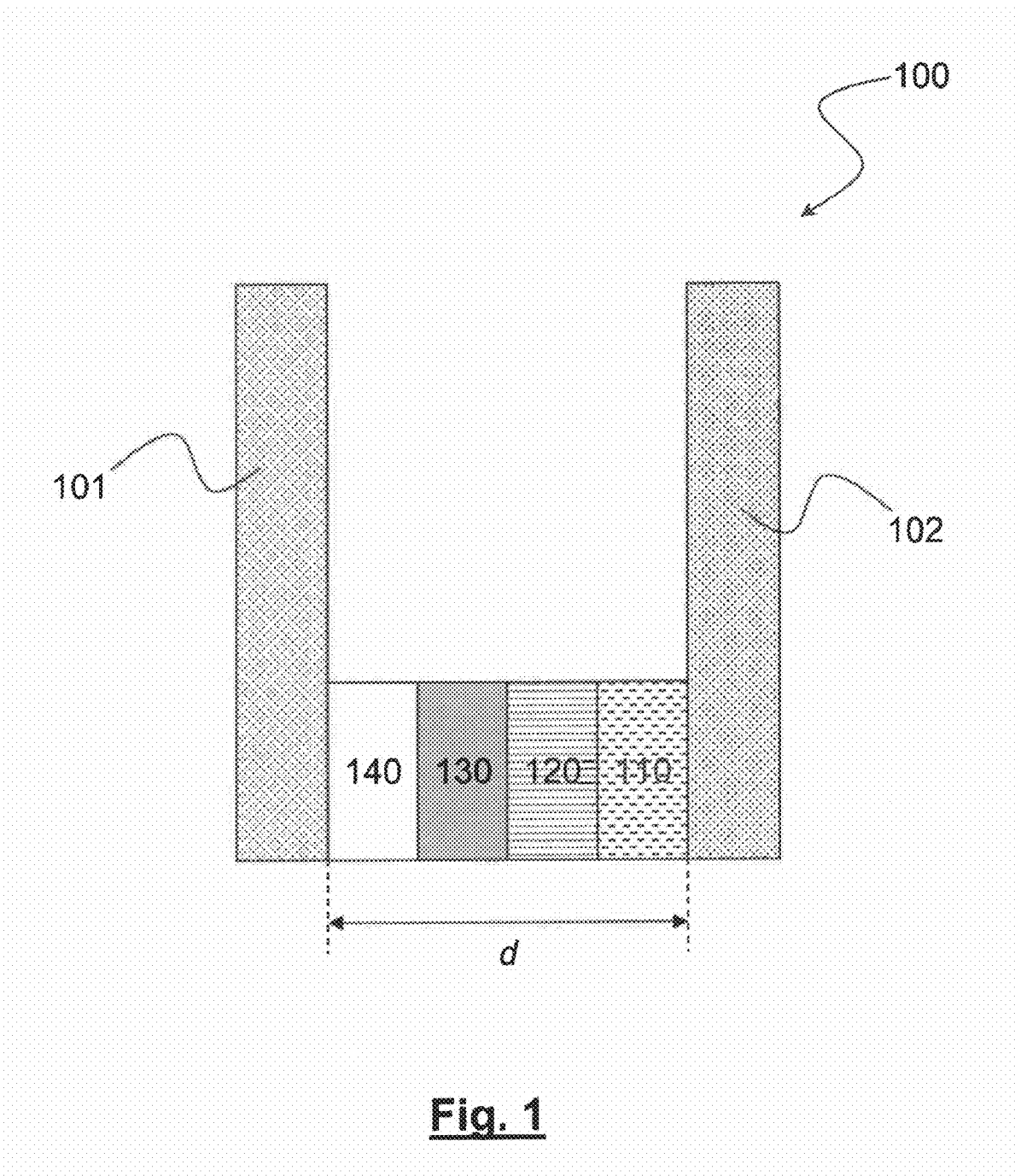
FIG. 1 schematically shows a magnetoresistive sensor with a spin valve in a CPP configuration, known in the prior art.

For a better understanding of the invention, we shall first analyze the spin transfer effect in a conventional magnetoresistive structure, like the one shown in FIG. 1.

Various regimes occur according to the value of the current density relative to the critical current density $j_c$ allowing the switching of the magnetization by spin transfer.

For a material with a planar magnetization, Li and Zhang have shown in the article "Magnetization dynamics with a spin-transfer torque" published in Physical Review B 68, 024404 (2003) that magnetic switching by spin transfer occurs for a critical current density $j_c$ corresponding to $a_j^{critical}$ given by the equation (2) such that $a_j^{critical} = \alpha(2\pi M_s + H_K)$, where $H_K$ is the magnetic anisotropic field of the magnetic layer concerned, the other quantities having been defined with regard to equation (1). Typically, in conventional spin valves with a CPP current geometry, $j_c$ is about a few $10^7$ A/cm$^2$. In MgO based tunnel junctions, $j_c$ has been reduced to values of about $10^6$ A/cm$^2$ thanks to the higher spin polarization of the electrons passing through the tunnel barrier and thanks to the use of materials having a lower magnetization and a low Gilbert damping.

For a much lower current density, the value of the critical density $j_c$ (typically lower than $j_c/10$), the spin transfer effect is practically imperceptible because the magnetic torque applied by the spin-polarized current is too weak to act on the magnetization of the sensitive layer.

For current densities from about $j_c$ to slightly less than $j_c$, that is typically of about from a few $10^5$ A/cm$^2$ to a few $10^6$ A/cm$^2$, the spin transfer effect becomes perceptible, long before the current density is sufficient to cause the magnetic switching by spin transfer. On the one hand, the effect depends on the respective orientations of the spin polarization and of the magnetization of the sensitive layer and, on the other, on the current direction.

We shall first assume that the magnetizations of the pinned layer and of the sensitive layer are parallel.

If the current flows from the sensitive layer to the pinned layer, that is if the electrons go from the pinned layer to the sensitive layer, the current favors a parallel alignment of the magnetization of the sensitive layer with regard to the magnetization of the pinned layer. In consequence, it is understandable that the spin transfer effect stabilizes the magnetization of the sensitive layer, which has the effect of reducing the magnetic fluctuations in this layer. This results in a decrease of the noise of magnetic origin in the zone (I) in FIG. 2. This operating zone corresponds to a frequency range defined according to the frequency $f_0$ of the FMR resonance line, and the half-width $\Delta f$ of this line measured at peak mid-height, on a power representation, with a linear scale of amplitudes and frequencies. More precisely, the zone I can be defined approximately as corresponding to the operating range $]0,\max(100 \text{ MHz}, f_0 - 3\Delta f)]$.

It can also be shown that in these conditions of magnetic configuration and current direction, the spin transfer effect increases the damping term in the equation (1). This is reflected by a broadening of the FMR resonance line in the zone (III) in FIG. 2. This corresponds to an increase in the average noise level in the frequency ranges corresponding to the feet of this FMR resonance line, in particular in the neighborhood of the boundary between the zone II and the zone III in FIG. 2.

If, now, the current flows from the pinned layer to the sensitive layer, that is if the electrons go from the sensitive layer to the pinned layer, the current promotes an antiparallel alignment of the magnetization of the sensitive layer and of that of the pinned layer. Physically, the electrons issuing from the sensitive layer which have a polarization antiparallel to that of the pinned layer are reflected by said layer and tend to reverse the magnetization of the sensitive layer when they again interact therewith. This makes it clear that the spin transfer effect makes the magnetization of the sensitive layer unstable and increases its fluctuations. This is reflected by an increase in the noise of magnetic origin in the zone (I) in FIG. 2. It can also be shown that the spin transfer effect in this regime is equivalent to a decrease in the Gilbert damping coefficient $\alpha$ in equation (1). This is reflected by a shrinkage of the FMR resonance line in the zone (III) in FIG. 2, and correlatively, a decrease in the noise level in the frequency ranges corresponding to the foot of this line, in particular in the transition zone between the zones II and III in FIG. 2. This transition zone can be defined approximately by the operating range $]\max(100 \text{ MHz}, f_0 - 3\Delta f), f_0 - 1.5\Delta f]$.

Figure 2:
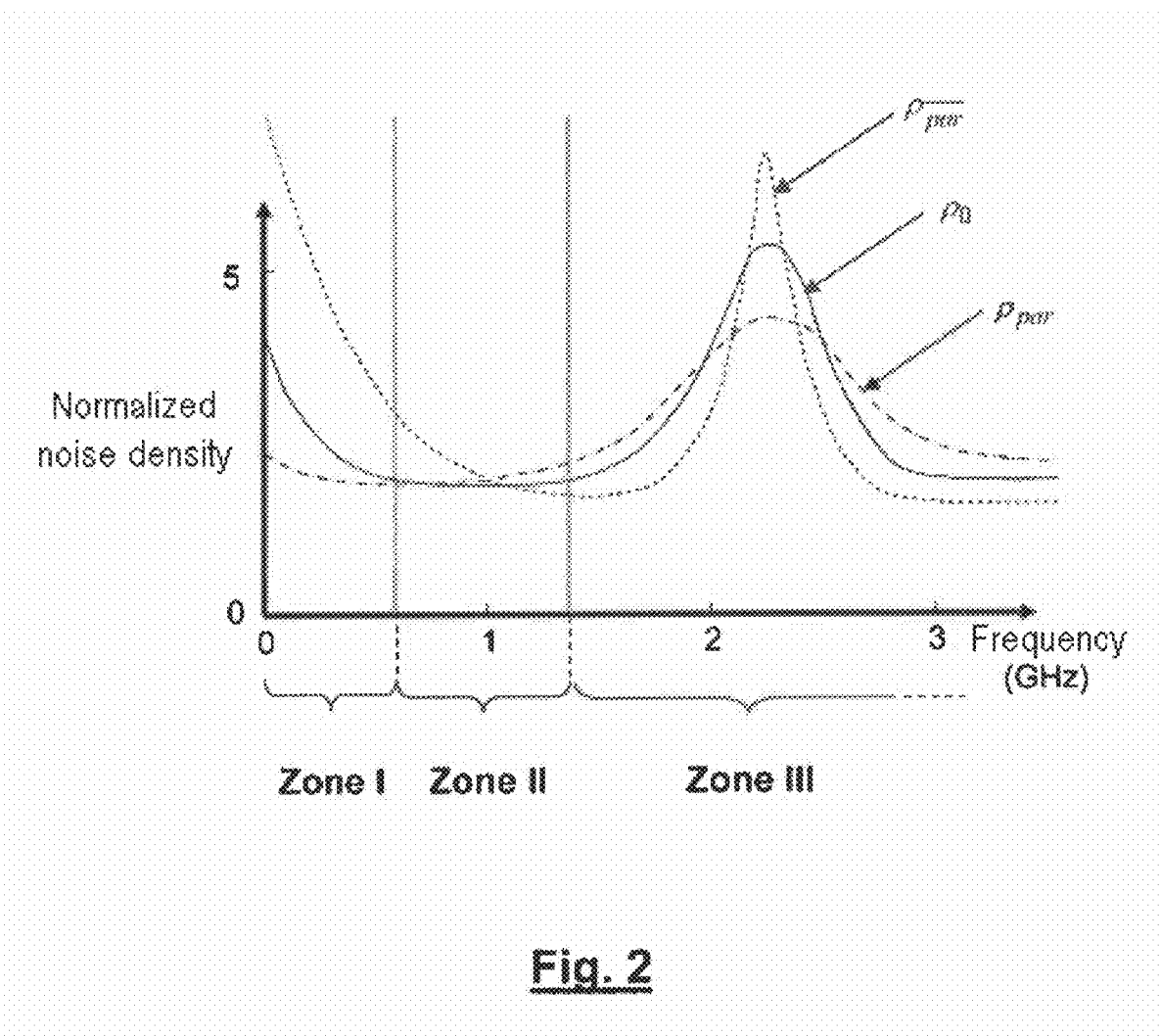
FIG. 2 shows the noise density affecting the measurement signal in the magnetoresistive sensor of FIG. 1.

The noise density curves, in the presence of spin transfer, have been shown in FIG. 2, in the case in which the current flows from the sensitive layer to the pinned layer. The typical noise curves have been denoted respectively $\rho_{par}$ and $\rho_{\overline{par}}$ in the situation in which the magnetizations of the sensitive and pinned layers are respectively in parallel and antiparallel alignment. If the current flow is from the pinned layer to the sensitive layer, the curves $\rho_{par}$ and $\rho_{\overline{par}}$ are swrapped.

We shall now assume that the respective magnetizations of the pinned layer and the sensitive layer are antiparallel.

The conclusions set out above must accordingly be reversed.

More precisely, if the current flows from the sensitive layer to the pinned layer, the spin transfer effect tends to return the magnetization of the sensitive layer parallel to that of the pinned layer, making the magnetic layer unstable, with the consequence of an increase in noise of magnetic origin in the zone (I) in FIG. 2 and a shrinkage of the resonance line in the zone (III).

On the other hand, if the current flows from the pinned layer to the sensitive layer, the spin transfer effect tends to reinforce the antiparallel alignment of the magnetizations of the sensitive and pinned layers, thereby stabilizing the magnetization of the sensitive layer, with the consequence of a decrease in the noise of magnetic origin in the zone (I) in FIG. 2 and a broadening of the resonance line in the zone (III).

In the present invention, magnetic noise is controlled by spin transfer by adding, in the magnetoresistive structure (CPP spin valve or MTJ junction) a second pinned layer, of which the magnetizations oriented in a particular direction that is indicated below. The second pinned layer serves to spin-polarize the current passing through the sensitive layer, and, by an appropriate choice of the orientation of the magnetization of the second pinned layer, serves to act on the density of magnetic fluctuations which may occur therein and hence on the amplitude of noise of magnetic origin resulting therefrom.

Figure 4:
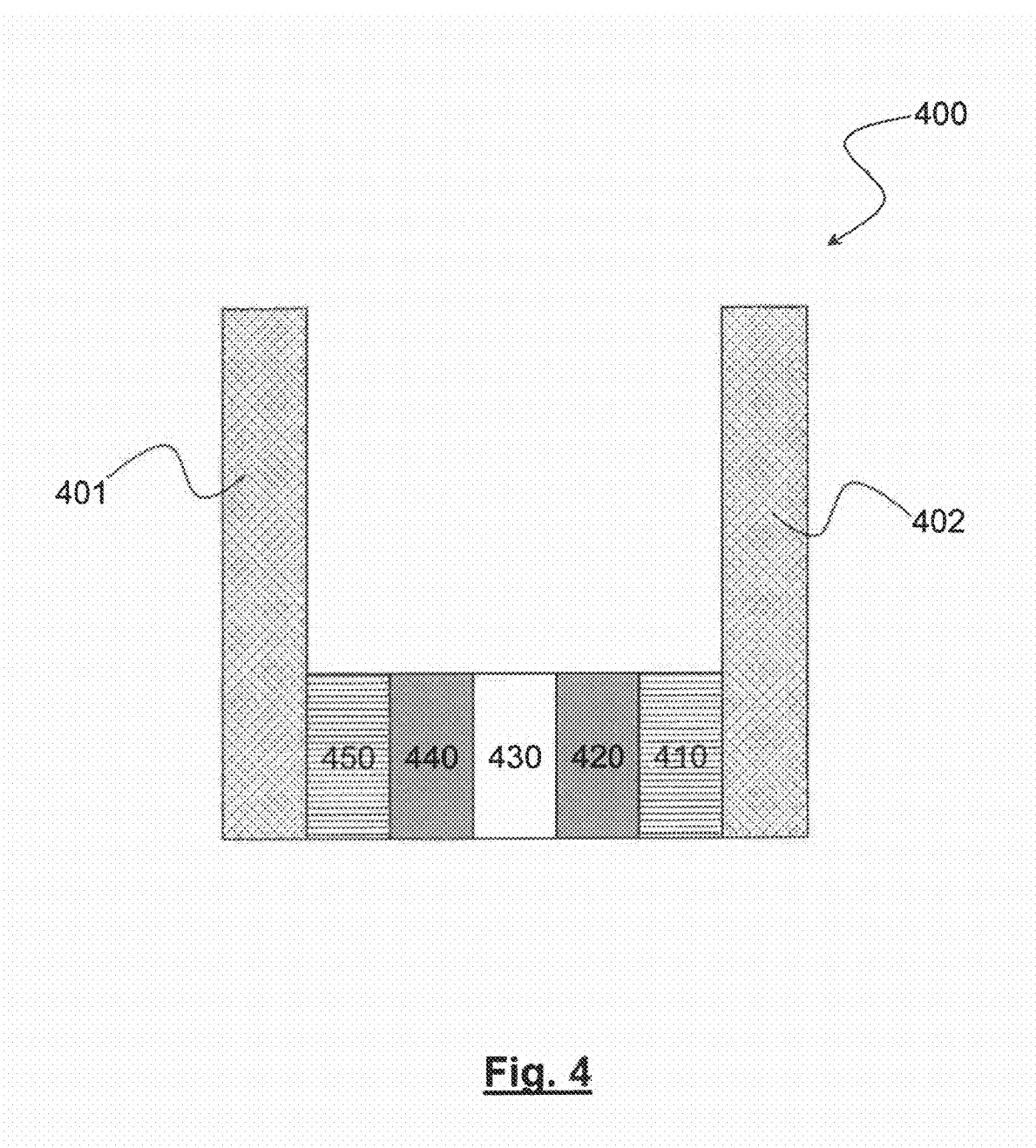
FIG. 4 schematically shows a magnetoresistive sensor according to one embodiment of the invention.

FIG. 4 shows the structure of a sensor according to one embodiment of the invention.

The sensor 400 comprises two metal screens 401 and 402 serving on the one hand to bound the magnetic field measurement zone, and on the other, to input a continuous current and to recover the measurement voltage.

As in the prior art, it also comprises a first magnetic layer 410, of which the magnetization is pinned by an antiferromagnetic layer (not shown), and a free magnetic layer 430, constituting the sensitive layer. A first nonmagnetic separating layer 420 serves to uncouple the two magnetic layers. The separating layer may be a metal layer, typically of Cu, as in the spin valves. It may also consist of a discontinuous oxide layer perforated with metal paths to confine the current lines and thereby increase the CPP resistance of the sensor (structure called a confined current path structure). Finally, this separating layer may consist of a fine semiconducting or insulating layer, for example of alumina or MgO, as in magnetic tunnel junctions.

The antiferromagnetic layer may consist of an alloy IrMn, PtMn, PtPdMn. The pinned layer is, for example, a single layer of CoFe 3 nm or made partly from a synthetic antiferromagnetic structure CoFe/Ru/CoFe as shall be shown below.

The first pinned magnetic layer 410 has a magnetization oriented along a fixed direction, substantially parallel to the direction of the magnetic field to be measured. In the absence of an applied magnetic field, the free magnetic layer has a magnetization in the plane thereof, substantially orthogonal to the magnetization of the first layer. This orthogonal orientation can be obtained by applying a bias magnetic field by means of a pair of lateral permanent magnets, for example made from alloy CoCr, located on either side of the magnetoresistive element. Alternatively, in the case in which this element is a tunnel junction, the orthogonal orientation of the magnetization of the free layer can be obtained by a permanent magnet layer located in the stack (in-stack bias) between the tunnel junction and the metal screens serving to convey the current. The magnetization of the permanent magnet layer is selected in the plane of the layers and orthogonal to that of the pinned layer. By partially closing through the free layer of the tunnel junction, the magnetic field generated by the permanent magnet layer polarizes the free layer in the desired direction.

The choice of an orthogonal polarization in the sensitive layer serves to obtain a linear response of the sensor, the magnetoresistance of the spin valve or of the tunnel junction varying as the cosine of the angle between the magnetizations of the sensitive layer and the pinned layer.

Unlike the prior art, the sensor 400 further comprises a second pinned magnetic layer 450, magnetically isolated from the free layer 430 by a second nonmagnetic separating layer 440. The second separating layer is preferably a conducting layer, for example a metal layer. It may also be a thin insulating layer forming a tunnel barrier or even a discontinuous oxide layer perforated with metal paths to confine the current lines.

The second magnetic layer has a magnetization of which the orientation is selected, as indicated below, to reduce or increase the magnetic fluctuations in the sensitive layer according to whether the sensor will operate toward the frequency zone I or toward the boundary between the zones II and III, that is in the neighborhood of the foot of the FMR resonance line (see FIG. 2). The magnetization of the sensitive layer in fact undergoes the combined influence of the spin transfer due to two pinned magnetic layers.

We shall first assume that the magnetoresistive sensor operates in the frequency band of the zone (I) as defined above in relation to FIG. 2.

Figure 5A:
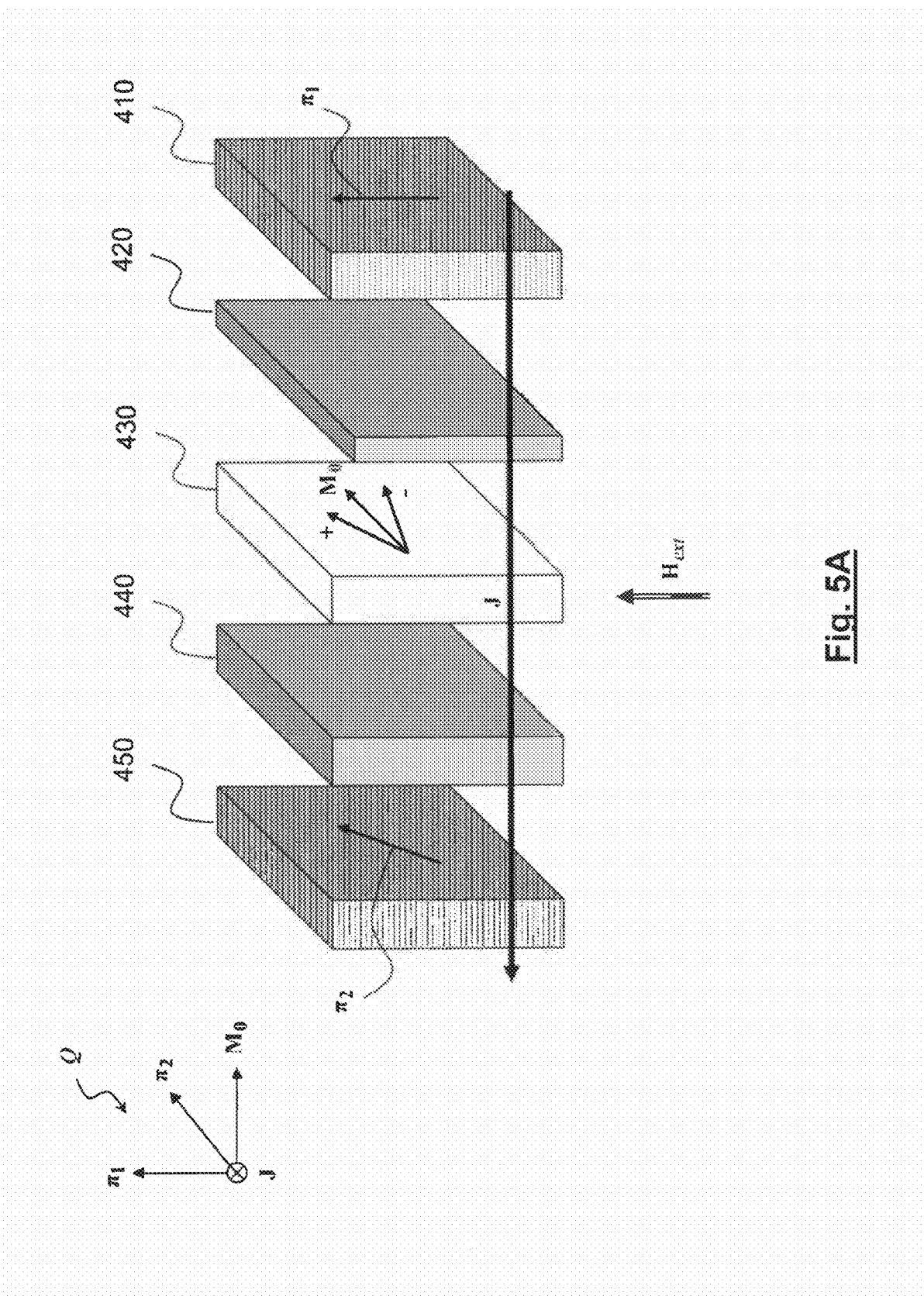
FIGS. 5A to 5D show various cases for reducing noise of magnetic origin in the magnetoresistive sensor in FIG. 4.
Figure 5B:
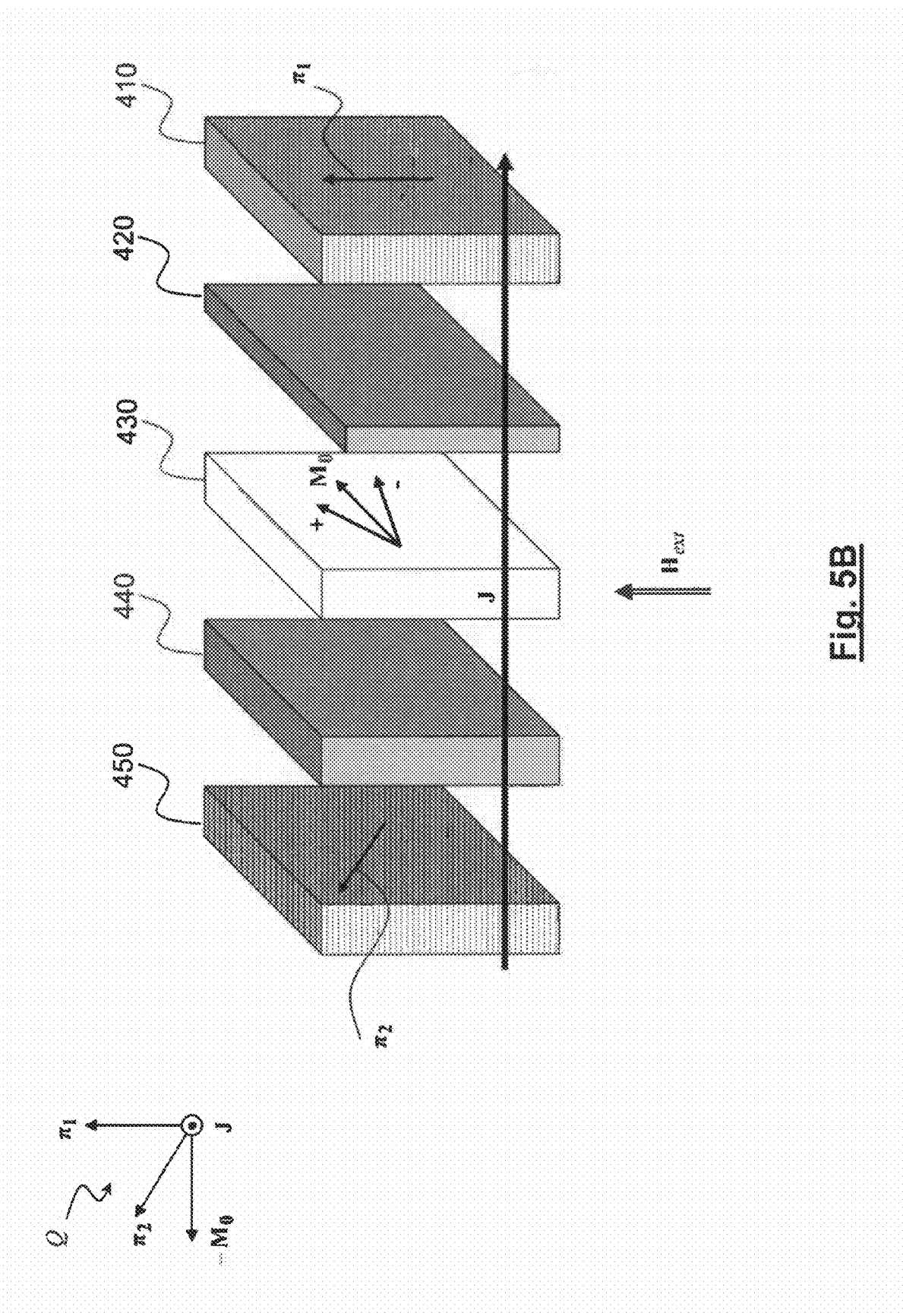

The configuration serving to reduce the magnetic noise is shown, in an exploded view, in FIG. 5A, when the current flows from the first pinned layer to the second pinned layer, and in FIG. 5B when it flows in the opposite direction.

In the absence of an applied external field, the direction of the magnetization of the free layer is substantially orthogonal to that of the first pinned layer, as indicated by $M_0$ in the figures. The spin transfer effect on the magnetization of the sensitive layer, due to the first pinned layer, is then intermediate between that of a parallel configuration and that of an antiparallel configuration, that is comprises both a stabilizing action and a destabilizing action. The orientation of the magnetization of the second pinned layer here is selected so as to decrease the destabilizing action and to reinforce the stabilizing action.

When the current J flows from the first to the second pinned layer, that is when the electrons go from the second to the first pinned layer, the magnetization direction of the second pinned layer, denoted $\pi_2$, is selected oriented along an intermediate direction (the extreme limits being included) between that of the magnetization of the first pinned layer, denoted $\pi_1$, and that of the magnetization of the sensitive layer, in the absence of an external magnetic field, as shown in FIG. 5A. In other words, the magnetization of the second pinned layer is located in the quadrant Q defined by the magnetization of the first pinned layer and the magnetization of the sensitive layer, in the absence of an external field, the extreme limits of the quadrant being permitted.

On the contrary, when the current J flows from the second to the first pinned layer, that is when the electrons go from the first to the second pinned layer, the magnetization direction of the second pinned layer, $\pi_2$, is selected oriented along an intermediate direction (the extreme limits being included) between the magnetization direction of the first pinned layer, $\pi_1$, and the direction opposite the magnetization of the sensitive layer, in the absence of an external magnetic field, as shown in FIG. 5B. In other words, the magnetization of the second pinned layer is located in the quadrant defined by the magnetization of the first pinned layer and the opposite of the magnetization of the sensitive layer, in the absence of an external field, the extreme limits of the quadrant being permitted.

In the case of FIG. 5A or 5B, the destabilizing action, by spin transfer effect, of the first pinned layer, is offset by the stabilizing action of the second pinned layer thanks to the magnetization component of this second pinned layer parallel to that of the first pinned layer. Moreover, thanks to the magnetization component of the second pinned layer, parallel or antiparallel (depending on the current direction) to the zero field magnetization of the sensitive layer, the magnetization of the pinned layer has a stabilizing effect on the magnetization of the sensitive layer.

It is therefore understandable that the configurations in FIGS. 5A and 5B, depending on the current direction, serve to reduce the noise of magnetic origin in a sensor operating in the frequency band of zone (I). Finally, the choice of the precise orientation of the magnetization of the second pinned layer within a quadrant serves to weight the spin transfer effects inside the sensitive layer, due respectively to the first and second pinned layers, and thereby to adjust the desired stabilization level. This orientation is determined by the relative amplitude of the prefactors $a_j(\theta)$ in the Slonczewski term (cf. equation (2)) associated with the first and second pinned layer. This prefactor is itself proportional to the polarization of the current issuing from each of these layers. The relative angle of $\pi_2$ with regard to $\pi_1$ is preferably determined experimentally.

We shall now assume that the magnetoresistive sensor operates in the transition frequency band between the zones II and III in FIG. 2, as defined above, that is at the foot of the FMR resonance peak.

Figure 5C:
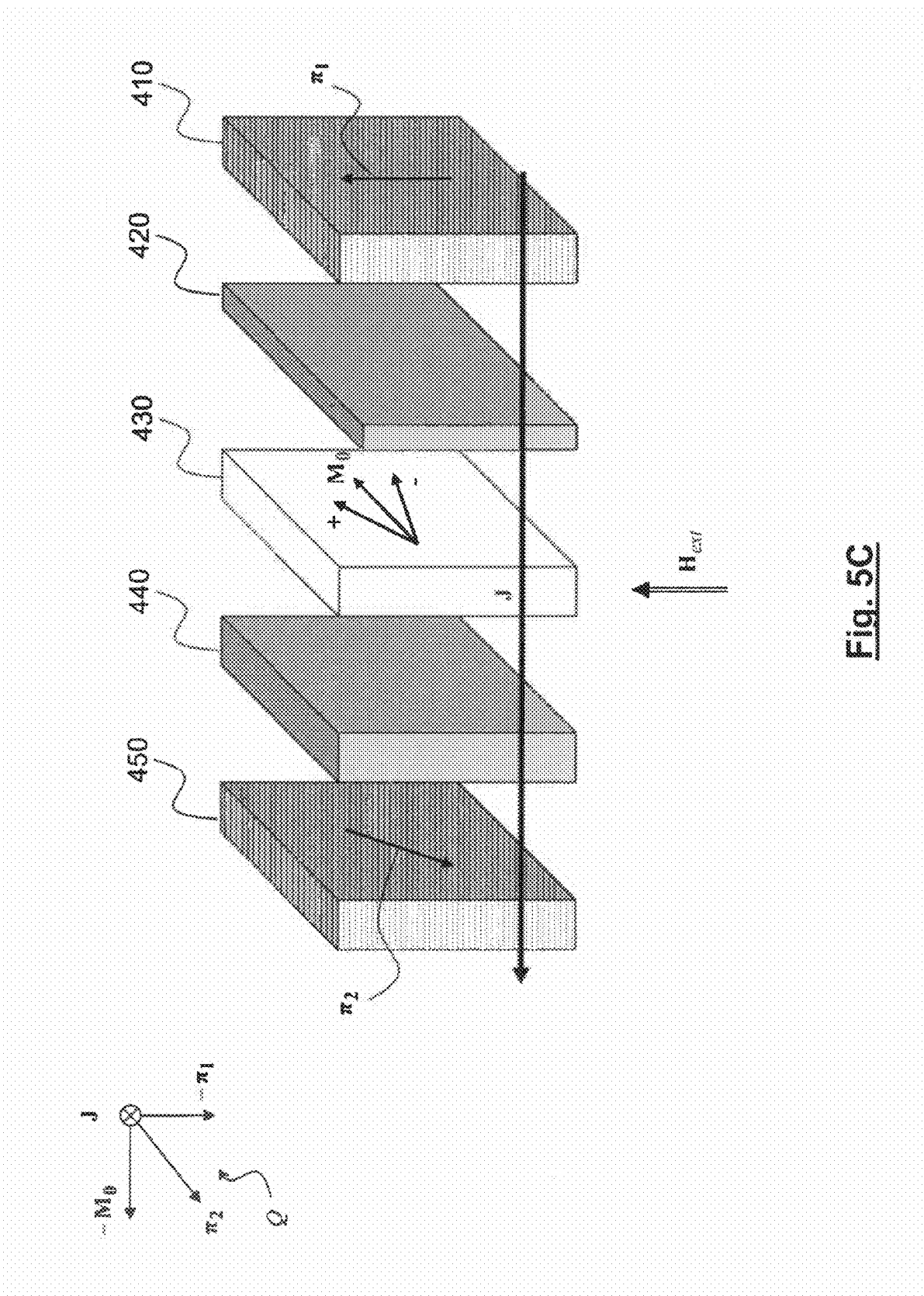
Figure 5D:
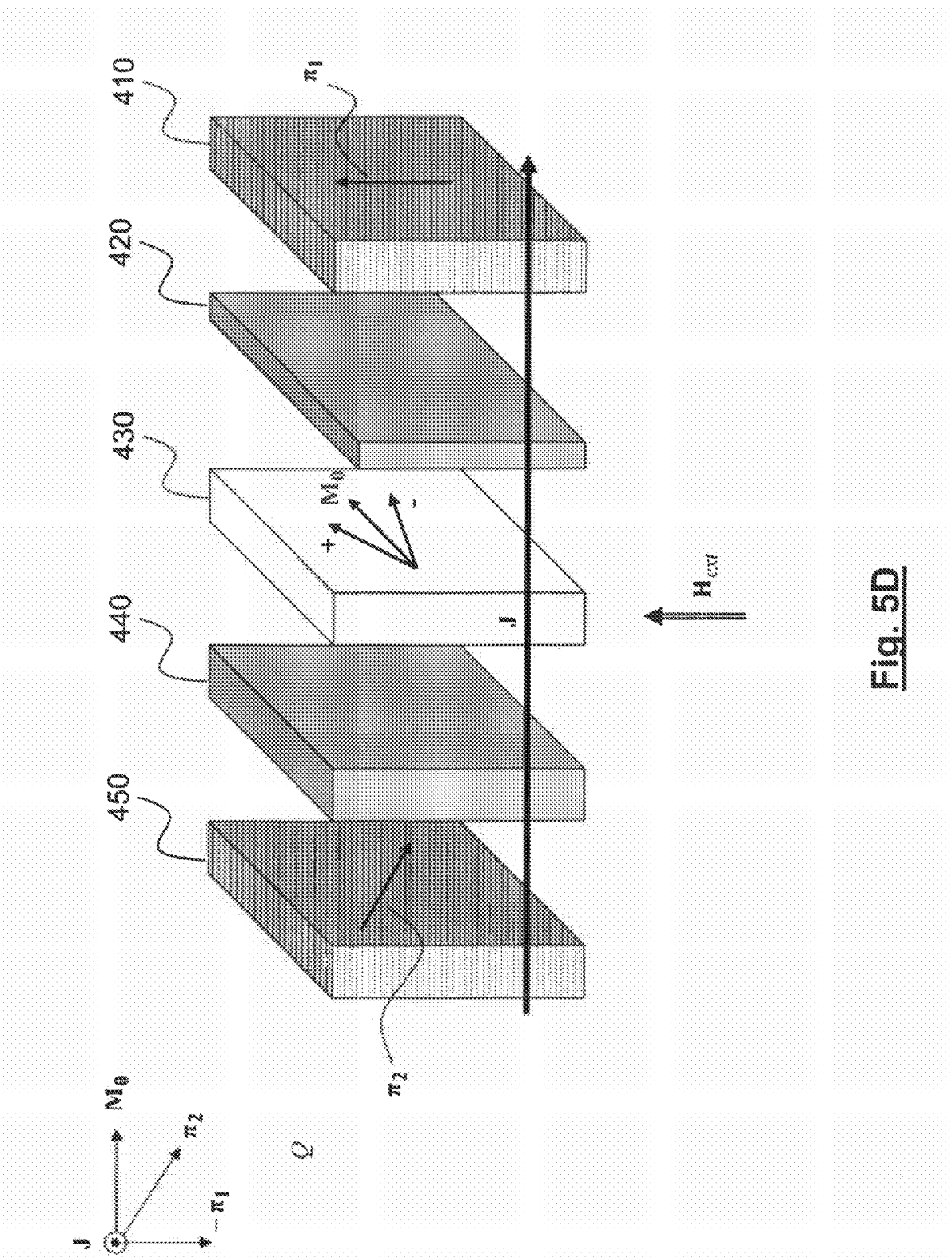

The configuration serving to reduce the magnetic noise is shown in FIG. 5C, when the current flows from the first pinned layer to the second pinned layer, and in FIG. 5D when it flows in the opposite direction.

When the current flows from the first to the second pinned layer, that is when the electrons go from the second to the first pinned layer, the magnetization direction of the second pinned layer is selected oriented along an intermediate direction (the limit orientations being included) between the opposite of that of the first pinned layer and the opposite of that of the sensitive layer, in the absence of an external magnetic field, as shown in FIG. 5C. In other words, the magnetization of the second pinned layer is located in the quadrant Q defined by the opposite of magnetization of the first pinned layer and the opposite of the magnetization of the sensitive layer, in the absence of an external field, the extreme limits of the quadrant being permitted.

On the other hand, when the current flows from the second to the first pinned layer, that is when the electrons go from the first to the second pinned layer, the magnetization direction of the second pinned layer is selected oriented along an intermediate direction (the extreme limits being included) between the opposite of the magnetization direction of the first pinned layer and the magnetization direction of the sensitive layer, in the absence of an external magnetic field, as shown in FIG. 5D. In other words, the magnetization of the second pinned layer is located in the quadrant Q defined by the opposite in the magnetization of the first pinned layer and the magnetization direction of the sensitive layer, in the absence of an external field, the extreme limits of the quadrant being permitted.

In the case of FIG. 5C or 5D, the destabilizing actions of the two pinned layers by spin transfer effect are cumulated.

The cumulation of the destabilizing actions causes a decrease in the damping coefficient included in the dynamic equation of the magnetization of the sensitive layer (1) and, in consequence, a shrinkage of the FMR resonance line and also a lowering of the noise level in the corresponding frequency ranges at the feet of the FMR resonance line.

This explains why the configurations in FIGS. 5C and 5D, depending on the current direction, serve to reduce the noise of magnetic origin in a magnetoresistive sensor operating in the abovementioned transition frequency band.

Concerning the magnetoresistance of the sensor according to the invention, it can be considered as a first approximation as deriving from two magnetoresistive sandwich structures in series, that is:

a first sandwich structure consisting of the first pinned magnetic layer 410, the first separating layer 420 and the sensitive magnetic layer 430, and a second sandwich structure consisting of the sensitive magnetic layer 430, the second separating layer 440 and the second pinned magnetic layer 450.

The resistances associated with these two sandwich structures can be considered as a first approximation as being in series. Thus, the magnetoresistance of the overall stack will be weighted by the relative weight of these two resistances. For the linearity of the sensor, it is preferable for the magnetoresistance to derive predominantly from the first sandwich structure of which the magnetizations of the zero field sensitive layer and the pinned layer are oriented substantially at 90° from one another. Accordingly, it is preferably for the second separating layer to be a conducting layer, for example a metal layer having a low resistance. On the other hand, the first separating layer is preferably a thin insulating layer forming a tunnel barrier or a discontinuous insulating layer perforated with metal paths designed to locally confine the current. Thus, the magnetoresistance is essentially determined by that of the abovementioned first structure.

The first separating layer may also be a metal layer. However, in this case, the weight in terms of resistance of the first and second magnetoresistant sandwich structures will be comparable. To have an additive effect of the magnetoresistances of these two contributions, it is then preferable to ensure the occurrence of the cases illustrated by the FIGS. 5*a* and 5*b* (resistive angle between the magnetizations of the two pinned layers lower than 90°).

The magnetoresistive sensor according to the invention can be produced as follows.

The method first preferably begins with the deposition of a nonmagnetic buffer layer on a current input electrode, for example one of the metal screens bounding the measurement zone. This buffer layer has the purpose of promoting the growth of the structure and may consist for example of NiFeCr 5 nm. The following are then carried out in succession:

(a) a first pinning antiferromagnetic layer, for example of PtMn, PtPdMn, or IrMn, preferably of PtMn having a thickness of 15 to 25 nm; then, either the following option (b1) or the option (b2):

(b1) a single magnetic layer directly in contact with the antiferromagnetic layer, for example a layer of CoFe alloy, rich in Co, having a typical thickness between 2 and 5 nm. This single layer thereby constitutes the first pinned magnetic layer of the sensor according to the invention; or (b2) an artificial ferrimagnetic composite layer consisting of:

a first pinned sub-layer in contact with the antiferromagnetic layer, for example a layer of CoFe alloy rich in Co having a typical thickness between 1.5 nm and 4 nm;

an Ru antiferromagnetic coupling layer having a typical thickness between 0.5 and 1 nm;

a second pinned sub-layer which thereby constitutes the first pinned magnetic layer of the sensor according to the invention. This second layer may consist of CoFe rich in Co, having a typical thickness of 1.5 nm to 4 nm, if the next layer (first separating layer) is metallic or insulating and perforated with metal paths designed to locally confine the current. It may consist of CoFeB or CoFe, having a face-centered cubic structure, if the next layer is insulating and having a face-centered cubic structure, as in MgO; the thickness of this layer is typically 1.5 nm to 5 nm;

(c) a nonmagnetic layer constituting the first separating layer of the sensor according to the invention. As already stated, it is preferably insulating, for example of alumina MgO or $TiO_x$, to produce a tunnel barrier. It may also be metallic, for example of Cu, to produce a spin valve. Finally, it may be a composite layer of insulation and metal, to produce a current confinement structure;

(d) a layer of CoFe alloy rich in Co, in particular $Co_{90}Fe_{10}$, constituting the free (or sensitive) layer of the sensor according to the invention. This layer may alternately be formed by the combination of two sub-layers, one of Co or of CoFe alloys, having a thickness of 0.5 to 1.5 nm, directly in contact with the first separating layer, the other of NiFe having a thickness of 1.5 nm to 4 nm to increase the magnetic softness of the preceding layer. A third sub-layer, for example of Co or CoFe alloys, having a thickness of 0.5 to 1.5 nm, can also be added to the first two at the interface with the second separating layer to avoid the interdiffusion effects between the NiFe and the second separating layer.

However, if the first underlying separating layer is of MgO with a face-centered cubic structure, it is preferable to use a CoFe alloy having the same structure or an amorphous CoFeB alloy which can then be annealed. Lattice mismatches at the interface are thereby avoided;

(e) a nonmagnetic layer constituting the second separating layer of the sensor according to the invention. It is preferably metallic, typically of Cu, having a thickness of about 2 to 5 nm. It may also be made of other materials, such as Au, Zr, Hf, Rh. This layer must be sufficiently thick to ensure the magnetic uncoupling between the sensitive magnetic layer and the second pinned magnetic layer, while being as thin as possible to avoid excessively increasing the total thickness of the sensor, this thickness defining the resolution of the read head;

(f) a magnetic layer, constituting the second pinned magnetic layer of the sensor according to the invention. This layer must be able to spin-polarize the current. Advantageously, a material is selected having spin diffusion or transmission effects, in its volume and/or at these interfaces, sufficiently strong to cause an asymmetry between the spin currents parallel and antiparallel to its magnetization.

According to a first alternative, a material is selected having a low spin diffusion length, in order to minimize the thickness of the layer. In fact, the spin polarization of the current is typically obtained on a length of about the spin diffusion length $l_{SF}$ (in a metal). Use is made for example of Permalloy ($Ni_{80}Fe_{20}$) having a $l_{SF}$ of about 5 nm at 300 K.

According to a second alternative, in replacement or supplementary to the first alternative, the spin diffusion effects at an interface are used to create this polarization. It is known for example that at the crossing of a Co/Cu interface, the electron current is depolarized by about 30%. The magnetic layer can then be laminated by inserting fine layers of Cu to take advantage of this effect and to favor the spin polarization of the current.

The second pinned magnetic layer can thereby be made from ferromagnetic transition metal (for example alloys based on Co, Fe, Ni typically $Co_{90}Fe_{10}$ having a typical thickness between 2 and 7 nm), or may consist of a stack of several layers (for example a laminated multilayer ($Co_{90}Fe_{10}$ 1 nm/Cu 0.3 nm)$_3$ or CoFe/NiFe lamination), or of a heterogeneous alloy (for example CoFeCu or CoFeAg rich in Co). If the magnetoresistive element is a tunnel junction or a current confinement structure, use can also be made of more resistive materials, such as magnetic oxides (for example magnetite) producing high spin polarizations.

Finally, the second pinned magnetic layer may form part of a synthetic ferrimagnetic composite layer, thereby serving to improve its spinning and to decrease the influence of its radiated field on the magnetization of the soft layer;

(g) a second pinning antiferromagnetic layer, for example of $Ir_{20}Mn_{80}$ having a typical thickness between 5 and 10 nm. Such a layer has a blocking temperature of about 200° C., lower then the blocking temperature of PtMn (~300° C.). To orient the magnetization of the first pinned layer along a first direction and the magnetization of the second pinned layer along a second direction, a first annealing can be carried out at 300° C. under a magnetic field oriented in the first direction, and then the structure can be cooled in the same field to 200° C. A magnetic field oriented in the second direction is then applied, and the temperature is then lowered to ambient temperature.

In general, this procedure can be followed insofar as two antiferromagnetic materials are available having different blocking temperatures. Let $t_1$ (respectively $t_2$) be the blocking temperature of the first (respectively second) pinning antiferromagnetic layer. If $t_1 > t_2$, the layers are annealed at $t_1$ under a magnetic field oriented along the desired direction for the magnetization of the first pinning layer, the temperature is then lowered to $t_2$, the magnetic field is then oriented along the desired direction for the magnetization of the second pinning layer, and the temperature is then lowered to the ambient temperature. If $t_2 > t_1$, the opposite procedure is followed: the layers are annealed at $t_2$ under a magnetic field oriented along said second direction, the temperature is then lowered to $t_1$, the magnetic field is then oriented along said first direction, and the temperature is then lowered to the ambient temperature.

According to one alternative, the second pinning layer may be a layer of hard magnetic material, for example of CoCr. In this case, the magnetization direction of this layer can be established by applying a strong magnetic field capable of saturating its magnetization in the desired direction.

The invention claimed is:

1. A magnetoresistive sensor comprising:
a first pinned-magnetization magnetic layer;
a free-magnetization magnetic layer;
a first separating layer for magnetic uncoupling, which separates the first pinned-magnetization magnetic layer from the free-magnetization magnetic layer;
a second pinned-magnetization magnetic layer; and
a second separating layer for magnetic uncoupling, which separates the second pinned-magnetization magnetic layer from the free-magnetization magnetic layer,
wherein the first and second separating layers are located on either side of said free-magnetization magnetic layer,
respective magnetization directions of said first pinned-magnetization magnetic layer and of said free-magnetization magnetic layer, in an absence of an external field, are substantially orthogonal,
said sensor is configured to circulate a continuous current from the first pinned-magnetization magnetic layer to the second pinned-magnetization magnetic layer, and
a magnetization of the second pinned-magnetization magnetic layer is oriented in an intermediate direction between the magnetization direction of the first pinned-magnetization magnetic layer and a magnetization direction of said free-magnetization magnetic layer, in the absence of the external field.

2. A magnetoresistive sensor comprising:
a first pinned-magnetization magnetic layer;
a free-magnetization magnetic layer;
a first separating layer for magnetic uncoupling, which separates the first pinned-magnetization magnetic layer from the free-magnetization magnetic layer;
a second pinned-magnetization magnetic layer; and
a second separating layer for magnetic uncoupling, which separates the second-pinned-magnetization magnetic layer from said free-magnetization magnetic layer,
wherein the first and second separating layers are located on either side of said free-magnetization magnetic layer,
respective magnetization directions of said first pinned-magnetization magnetic layer and of said free-magnetization magnetic layer, in an absence of an external field, are substantially orthogonal,
said sensor is configured to circulate a continuous current from the first pinned-magnetization magnetic layer to the second pinned-magnetization magnetic layer, and
a magnetization of the second pinned-magnetization magnetic layer is oriented in an intermediate direction between the magnetization direction of the first pinned-magnetization magnetic layer and a direction opposite to the magnetization direction of said free-magnetization magnetic layer, in the absence of the external field.

3. A magnetoresistive sensor comprising:
a first pinned-magnetization magnetic layer;
a second free-magnetization magnetic layer;
a first separating layer for magnetic uncoupling, which separates the first pinned-magnetization magnetic layer from the free-magnetization magnetic layer;
a second pinned-magnetization magnetic layer;
a second separating layer for magnetic uncoupling, which separates the second pinned-magnetization magnetic layer from the free-magnetization magnetic layer,
wherein the first and second separating layers are located on either side of said free-magnetization magnetic layer,
respective magnetization directions of said first pinned-magnetization magnetic layer and of said free-magnetization magnetic layer, in an absence of an external field, being substantially orthogonal, said sensor is configured to circulate a continuous current from the first pinned-magnetization magnetic layer to the second pinned-magnetization magnetic layer, and a magnetization of the second pinned-magnetization magnetic layer is oriented in an intermediate direction between a direction opposite to the magnetization direction of the first pinned-magnetization magnetic layer and a direction opposite to the magnetization direction of said free-magnetization magnetic layer, in the absence of the external field.

4. A magnetoresistive sensor comprising:
a first pinned-magnetization magnetic layer;
a free-magnetization magnetic layer;
a first separating layer for magnetic uncoupling, which separates the first pinned-magnetization magnetic layer from the free-magnetization magnetic layer;
a second pinned-magnetization magnetic layer; and
a second separating layer for magnetic uncoupling, which separates the second pinned-magnetization magnetic layer from the free-magnetization magnetic layer,
wherein the first and second separating layers are located on either side of said free-magnetization magnetic layer,
respective magnetization directions of said first pinned-magnetization magnetic layer and of said free-magnetization magnetic layer, in an absence of an external field, being substantially orthogonal,
said sensor is configured to circulate a continuous current from the first pinned-magnetization magnetic layer to the second pinned-magnetization magnetic layer, and
a magnetization of the second pinned-magnetization magnetic layer is oriented in an intermediate direction between a direction opposite to the magnetization direction of the first pinned-magnetization magnetic layer and the magnetization direction of said free-magnetization magnetic layer, in the absence of the external field.

5. The magnetoresistive sensor as in any one of claims 1, 2, 3, and 4, wherein an electrical resistance of the free-magnetization magnetic layer/first separating layer/first pinned-magnetization magnetic layer stack is higher than an electrical resistance of the free-magnetization magnetic layer/second separating layer/second pinned-magnetization magnetic layer stack.

6. The magnetoresistive sensor as in any one of claims 1, 2, 3, and 4, wherein the first separating layer is a layer of insulation forming a tunnel barrier.

7. The magnetoresistive sensor as as in any one of claims 1, 2, 3, and 4, wherein the first separating layer is a metal layer.

8. The magnetoresistive sensor as as in any one of claims 1, 2, 3, and 4, wherein the first separating layer is a composite metal-insulation layer, suitable for locally confining current paths.

9. The magnetoresistive sensor as in any one of claims 1, 2, 3, and 4, wherein the second separating layer is a metal layer.

10. The magnetoresistive sensor as claimed in claim 7, wherein a surface resistance of the second separating layer is lower than that of the first separating layer.

11. The magnetoresistive sensor as in any one of claims 1, 2, 3, and 4, wherein the second separating layer is a composite metal-insulation layer, suitable for locally confining current paths.

12. The magnetoresistive sensor as in any one of claims 1, 2, 3, and 4, further comprising:
a first synthetic ferrimagnetic layer, consisting of first and second magnetic sub-layers containing a first antiferromagnetic coupling layer in a sandwich, the first magnetic sub-layer being pinned by a first antiferromagnetic pinning layer, the second magnetic sub-layer constituting the first pinned-magnetization magnetic layer.

13. The magnetoresistive sensor as claimed in claim 6, wherein the first separating layer consists of alumina.

14. The magnetoresistive sensor as claimed in claim 6, wherein the first separating layer consists of MgO.

15. The magnetoresistive sensor as claimed in claim 12, wherein the first synthetic ferrimagnetic magnetic layer is CoFe/Ru/CoFe, where the first and second CoFe magnetic sub-layers have a thickness of 1.5 to 4 nm and the first Ru antiferromagnetic coupling sub-layer has a thickness of 0.5 to 1 nm.

16. The magnetoresistive sensor as claimed in claim 12, wherein the first synthetic ferrimagnetic layer is CoFe/Ru/CoFeB or CoFe/Ru/CoFe, where the first CoFe magnetic sub-layer has a thickness of 1.5 to 4 nm, the first Ru antiferromagnetic sub-layer has a thickness of 0.5 to 1 nm, and the second magnetic sub-layer consists of CoFeB or CoFe alloy having a face-centered cubic structure with a thickness of between 1.5 and 5 nm.

17. The magnetoresistive sensor as claimed in claim 12, wherein the first antiferromagnetic pinning layer consists of PtMn, PtPdMn, or IrMn.

18. The magnetoresistive sensor as claimed in claim 17, wherein the first antiferromagnetic pinning layer consists of PtMn having a thickness of 15 to 25 nm.

19. The magnetoresistive sensor as in any one of claims 1, 2, 3, and 4, wherein the free-magnetization magnetic layer consists of CoFe alloy.

20. The magnetoresistive sensor as in any one of claims 1, 2, 3, and 4, wherein the free-magnetization magnetic layer consists of two sub-layers, one sub-layer of Co or CoFe alloys, having a total thickness of 0.5 to 1.5 nm, directly at an interface between the first separating layer, and another sub-layer of NiFe having a thickness of about 2 to 4 nm.

21. The magnetoresistive sensor as claimed in claim 9, wherein the second separating layer consists of Cu having a thickness of 2 to 5 nm.

22. The magnetoresistive sensor as in claim 12, further comprising:
a second synthetic ferrimagnetic layer, consisting of third and fourth magnetic sub-layers containing a second antiferromagnetic coupling layer in a sandwich, the fourth magnetic sub-layer being pinned by a second pinning antiferromagnetic layer, the third magnetic sub-layer constituting the second pinned-magnetization magnetic layer.

23. The magnetoresistive sensor as claimed in claim 22, wherein the second pinning antiferromagnetic layer consists of $Ir_{20}Mn_{80}$ having a thickness between 5 and 10 nm.

24. The magnetoresistive sensor as claimed in claim 12, further comprising:
a second synthetic ferrimagnetic layer, consisting of third and fourth magnetic sub-layers containing a second antiferromagnetic coupling layer in a sandwich, the fourth magnetic sub-layer being pinned by a layer of hard magnetic material, the third magnetic-layer constituting the second pinned-magnetization magnetic layer.

25. The magnetoresistive sensor as claimed in claim 24, wherein the hard magnetic material is an alloy based on Co and Cr.

26. The magnetoresistive sensor as in any one of claims 1, 2, 3, and 4, wherein the second pinned-magnetization magnetic layer consists of a ferromagnetic transition metal.

27. The magnetoresistive sensor as claimed in claim 26, wherein the second pinned-magnetization magnetic layer consists of $Co_{90}Fe_{10}$ having a thickness of between 2 and 7 nm.

28. The magnetoresistive sensor as as in any one of claims 1, 2, 3, and 4, wherein the second pinned-magnetization magnetic layer consists of CoFeCu or CoFeAg alloy.

29. The magnetoresistive sensor as in any one of claims 1, 2, 3, and 4, wherein the second pinned-magnetization magnetic layer is a laminated multilayer of $Co_{90}Fe_{10}$/Cu, with the $Co_{90}$ being 1 nm thick and the Cu being 0.3 nm thick, or a CoFe/NiFe bilayer.

30. The magnetoresistive sensor as claimed in claim 1, wherein the first pinned-magnetization magnetic layer has its magnetization pinned in a first direction by a first pinning antiferromagnetic layer having a first blocking temperature, and wherein the second pinned-magnetization magnetic layer has its magnetization pinned in a second direction by a second pinning antiferromagnetic layer having a second blocking temperature different from the first blocking temperature.

31. A method for fabricating a magnetoresistive sensor comprising:
   forming a magnetoresistive sensor, including
   a first pinned-magnetization magnetic layer,
   a free-magnetization magnetic layer,
   a first separating layer for magnetic uncoupling, which separates the first pinned-magnetization magnetic layer from the free-magnetization magnetic layer;
   a second pinned-magnetization magnetic layer, and
   a second separating layer for magnetic uncoupling, which separates the second pinned-magnetization magnetic layer from the free-magnetization magnetic layer,
   wherein the first and second separating layers are located on either side of said free-magnetization magnetic layer,
   respective magnetization directions of said first pinned-magnetization magnetic layer and of said free-magnetization magnetic layer, in an absence of an external field, are substantially orthogonal,
   said sensor is configured to circulate a continuous current from the first pinned-magnetization magnetic layer to the second pinned-magnetization magnetic layer,
   a magnetization of the second pinned-magnetization magnetic layer is oriented in an intermediate direction between the magnetization direction of the first pinned-magnetization magnetic layer and a magnetization direction of said free-magnetization magnetic layer, in the absence of the external field,
   the first pinned-magnetization magnetic layer has its magnetization pinned in a first direction by a first pinning antiferromagnetic layer having a first blocking temperature, and wherein the second pinned-magnetization magnetic layer has its magnetization pinned in a second direction by a second pinning antiferromagnetic layer having a second blocking temperature different from the first blocking temperature;
   wherein the forming includes depositing the first pinning antiferromagnetic layer, the first pinned-magnetization magnetic layer, the first separating layer, the free-magnetization magnetic layer, the second separating layer, the second pinned-magnetization magnetic layer, and the second pinning antiferromagnetic layer in succession on an electrode, and
   if the first blocking temperature is higher than the second blocking temperature, the forming includes annealing the first pinning antiferromagnetic layer, the first pinned-magnetization magnetic layer, the first separating layer, the free-magnetization magnetic layer, the second separating layer, the second pinned-magnetization magnetic layer, and the second pinning antiferromagnetic layer under a magnetic field oriented along said first direction, and the method further includes lowering a temperature to the second blocking temperature, then orienting the magnetic field along said second direction, and then lowering the temperature to an ambient temperature, and
   if the second blocking temperature is higher than the first blocking temperature, the forming includes annealing the first pinning antiferromagnetic layer, the first pinned-magnetization magnetic layer, the first separating layer, the free-magnetization magnetic layer, the second separating layer, the second pinned-magnetization magnetic layer, and the second pinning antiferromagnetic layer under a magnetic field oriented along said second direction, and the method further includes lowering the temperature to the first blocking temperature, then orienting the magnetic field along said first direction, and then lowering the temperature to the ambient temperature.

* * * * *